(12) United States Patent
Moriyama et al.

(10) Patent No.: US 9,947,702 B2
(45) Date of Patent: Apr. 17, 2018

(54) SOLID-STATE IMAGING APPARATUS, METHOD FOR MANUFACTURING THE SAME, AND IMAGING SYSTEM (71) Applicant: CANON KABUSHIKI KAISHA, Tokyo (JP)

(72) Inventors: Takashi Moriyama, Yokohama (JP); Masaaki Minowa, Kawasaki (JP); Takeshi Ichikawa, Hachioji (JP); Masahiro Ogawa, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/637,155

(22) Filed: Jun. 29, 2017

(65) Prior Publication Data
US 2017/0317121 A1 Nov. 2, 2017

Related U.S. Application Data (63) Continuation of application No. 14/489,812, filed on Sep. 18, 2014, now Pat. No. 9,761,618.

(30) Foreign Application Priority Data

Oct. 7, 2013 (JP) .................................. 2013-210588

(51) Int. Cl.
H01L 27/146 (2006.01)
H04N 5/33 (2006.01)
(Continued)

(52) U.S. Cl.
CPC .... *H01L 27/14607* (2013.01); *H01L 27/1461* (2013.01); *H01L 27/14643* (2013.01);
(Continued)

(58) Field of Classification Search
CPC .......... H01L 27/14607; H01L 27/1461; H01L 27/14643; H01L 27/14645; H01L 27/14649; H01L 27/14689
See application file for complete search history.

(56) References Cited

U.S. PATENT DOCUMENTS 6,310,366 B1 10/2001 Rhodes et al.
6,639,293 B2 10/2003 Furumiya et al.
(Continued)

FOREIGN PATENT DOCUMENTS

CN 1487589 A 4/2004
EP 1542286 A2 6/2005
(Continued)

OTHER PUBLICATIONS

Office Action dated Mar. 13, 2017, in Japanese Patent Application No. 2013-210588.
(Continued)

*Primary Examiner* — Seahvosh Nikmanesh
(74) *Attorney, Agent, or Firm* — Fitzpatrick, Cella, Harper & Scinto (57) ABSTRACT A solid-state imaging apparatus, comprising a first semiconductor region of a first conductivity type provided on a substrate by an epitaxial growth method, a second semiconductor region of the first conductivity type provided on the first semiconductor region, and a third semiconductor region of a second conductivity type provided in the second semiconductor region so as to form a pn junction with the second semiconductor region, wherein the first semiconductor region is formed such that an impurity concentration decreases from a side of the substrate to a side of the third semiconductor region, and an impurity concentration distribution in the second semiconductor region is formed by an ion implantation method.

18 Claims, 6 Drawing Sheets (51) Int. Cl.
*H04N 5/265* (2006.01)
*H04N 5/374* (2011.01)
*H04N 5/232* (2006.01)

(52) U.S. Cl.
CPC .. *H01L 27/14645* (2013.01); *H01L 27/14649* (2013.01); *H01L 27/14689* (2013.01); *H04N 5/23293* (2013.01); *H04N 5/265* (2013.01); *H04N 5/33* (2013.01); *H04N 5/374* (2013.01)

(56) References Cited

U.S. PATENT DOCUMENTS

| | | | |
|---|---|---|---|
| 7,247,899 | B2 | 7/2007 | Kuwabara et al. |
| 7,323,731 | B2 | 1/2008 | Yuzurihara et al. |
| 7,436,343 | B2 | 10/2008 | Ichikawa |
| 7,473,948 | B2 | 1/2009 | Yuzurihara et al. |
| 7,679,116 | B2 | 3/2010 | Yuzurihara et al. |
| 7,687,299 | B2 | 3/2010 | Ichikawa |
| 7,701,029 | B2 | 4/2010 | Mabuchi |
| 7,928,486 | B2 | 4/2011 | Yuzurihara et al. |
| 7,968,922 | B2 | 6/2011 | Ichikawa |
| 8,084,837 | B2 | 12/2011 | Mabuchi |
| 8,384,178 | B2 | 2/2013 | Mabuchi |
| 8,466,499 | B2 | 6/2013 | Mabuchi |
| 8,749,683 | B2 | 6/2014 | Minowa et al. |
| 8,779,544 | B2 | 7/2014 | Yamashita et al. |
| 9,761,618 | B2 * | 9/2017 | Moriyama ........ H01L 27/14607 |
| 2003/0214595 | A1 | 11/2003 | Mabuchi |
| 2005/0056905 | A1 | 3/2005 | Kuwabara et al. |
| 2010/0327332 | A1 | 12/2010 | Okino et al. |
| 2011/0163407 | A1 | 7/2011 | Yuzurihara et al. |
| 2012/0267747 | A1 | 10/2012 | Watanabe et al. |
| 2013/0049156 | A1 | 2/2013 | Furukawa et al. |
| 2013/0083225 | A1 | 4/2013 | Minowa et al. |
| 2014/0036121 | A1 | 2/2014 | Minowa et al. |

FOREIGN PATENT DOCUMENTS

| | | |
|---|---|---|
| EP | 1612863 A2 | 1/2006 |
| EP | 2416361 A2 | 2/2012 |
| EP | 2565925 A2 | 3/2013 |
| JP | H01-091453 A | 4/1989 |
| JP | H07-273364 A | 10/1995 |
| JP | H08-316446 A | 11/1996 |
| JP | 2002-170945 A | 6/2002 |
| JP | 2005-093525 A | 4/2005 |
| JP | 2005-303154 A | 10/2005 |
| JP | 2006-073609 A | 3/2006 |
| JP | 2008-034836 A | 2/2008 |
| JP | 2008-263227 A | 10/2008 |
| JP | 2009-088545 A | 4/2009 |
| JP | 2010-056402 A | 3/2010 |
| JP | 2010-177594 A | 8/2010 |
| JP | 2011-119543 A | 6/2011 |
| JP | 2011-205040 A | 10/2011 |
| WO | 2011/067916 A1 | 6/2011 |

OTHER PUBLICATIONS

Dec. 2, 2016 Chinese Office Action corresponding to Chinese Patent Application No. 201410499673.6.
Mar. 26, 2015 Partial European Search Report in cournterpart European Application No. 14184612.
Jul. 29, 2015 Extended European Search Report in counterpart European Application No. 14184612.

* cited by examiner

SOLID-STATE IMAGING APPARATUS, METHOD FOR MANUFACTURING THE SAME, AND IMAGING SYSTEM

This is a continuation of U.S. patent application Ser. No. 14/489,812, filed Sep. 18, 2014.

BACKGROUND OF THE INVENTION

Field of the Invention

The present invention relates to a solid-state imaging apparatus, a method for manufacturing the same, and an imaging system.

Description of the Related Art

A solid-state imaging apparatus includes a photoelectric conversion portion (pn-junction diode) formed on a substrate and reads out charges generated by light which has been incident on the photoelectric conversion portion. Japanese Patent Laid-Open No. 2008-034836 discloses a photoelectric conversion portion which is formed by a p-type epitaxial layer provided on a substrate and an n-type epitaxial layer provided on the p-type epitaxial layer. The p-type epitaxial layer is formed such that a p-type impurity concentration decreases from the lower side to the upper side. The n-type epitaxial layer is formed such that an n-type impurity concentration increases from the lower side to the upper side. According to a structure described in Japanese Patent Laid-Open No. 2008-034836, for example, the movement in the horizontal direction of charges generated by photoelectric conversion is suppressed, thereby preventing a crosstalk between pixels.

The charges generated by photoelectric conversion can move under the influence of a potential distribution which is determined by the impurity concentration distribution of the photoelectric conversion portion. Each of the above-described n-type and p-type epitaxial layers is formed by epitaxial growth while adjusting a dopant concentration in an epitaxial growth chamber. It is not easy to accurately control the impurity concentration distribution. Hence, according to a photoelectric conversion portion formed by an epitaxial growth method, it is difficult to improve charge transfer efficiency for reading out the charges generated by photoelectric conversion.

SUMMARY OF THE INVENTION

The present invention is advantageous in improving transfer efficiency of charges generated by photoelectric conversion.

One of the aspects of the present invention provides a solid-state imaging apparatus comprising a first semiconductor region of a first conductivity type provided on a substrate by an epitaxial growth method, a second semiconductor region of the first conductivity type provided on the first semiconductor region, and a third semiconductor region of a second conductivity type provided in the second semiconductor region such that a pn junction is formed between the second semiconductor region and the third semiconductor region, wherein the first semiconductor region is formed such that an impurity concentration of the first semiconductor region decreases as a position within the first semiconductor region goes from a side of the substrate toward a side of the third semiconductor region, and an impurity concentration distribution in the second semiconductor region is formed by an ion implantation method.

Further features of the present invention will become apparent from the following description of exemplary embodiments with reference to the attached drawings.

DESCRIPTION OF THE EMBODIMENTS

First Embodiment

Figure 1:
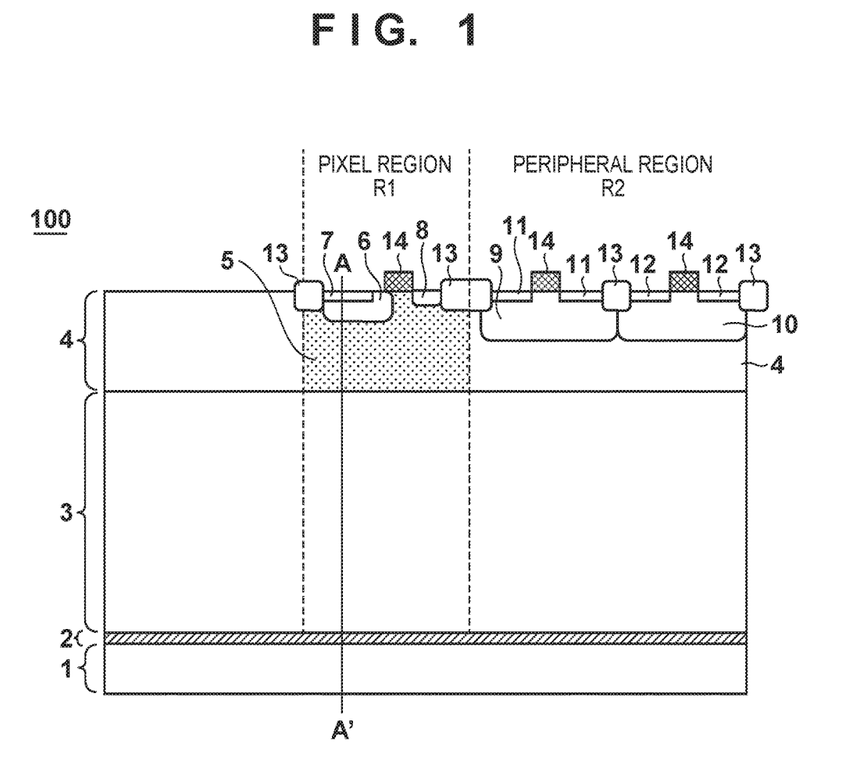
FIG. 1 is a view showing an example of the arrangement of a solid-state imaging apparatus.

The first embodiment will be described with reference to FIG. 1 to FIGS. 5A to 5F. FIG. 1 is a schematic view for explaining the structure of a solid-state imaging apparatus 100 according to this embodiment. The solid-state imaging apparatus 100 includes a pixel region R1 in which pixels are arrayed and a peripheral region R2 in which a unit for exchanging signals between respective pixels is arranged. For the descriptive simplicity, the pixel region R1 is illustrated to include one pixel. The unit in the peripheral region R2 includes, for example, at least one of a driving unit configured to drive each pixel, a signal processing unit configured to process a signal read out from each pixel, and an output unit configured to output the signal read out from each.

The solid-state imaging apparatus 100 includes a p-type (first conductivity type) substrate 1, a p-type semiconductor region 2 provided in the upper portion of the substrate 1, a p-type semiconductor region 3 provided on the p-type semiconductor region 2, and an n-type (second conductivity type) semiconductor region 4 provided on the p-type semiconductor region 3. The p-type semiconductor region 2 is a high-concentration impurity region formed by implanting a p-type impurity in the substrate 1. The p-type semiconductor region 3 is the first epitaxial layer formed above the substrate 1 (on the p-type semiconductor region 2) by an epitaxial growth method. The p-type semiconductor region 3 is formed such that a p-type impurity concentration decreases from the lower side to the upper side. That is, the p-type semiconductor region 3 is formed such that the p-type impurity concentration decreases from the side of the substrate 1 to the side of an n-type semiconductor region 6 to be described later. The n-type semiconductor region 4 is the second epitaxial layer formed on the p-type semiconductor region 3 by the epitaxial growth method. The n-type semiconductor region 4 is provided, while contacting the p-type semiconductor region 3, to be adjacent to a p-type semiconductor region 5 to be described later.

The solid-state imaging apparatus 100 also includes, in the pixel region R1, the p-type semiconductor region 5 adjacent to the n-type semiconductor region 4. The p-type semiconductor region 5 is a p-type well which is formed in a region formed on the p-type semiconductor region 3 (a region formed simultaneously with the n-type semiconductor region 4) by an ion implantation method. Alternatively, the p-type semiconductor region 5 may be provided in the upper portion of the p-type semiconductor region 3. Respective elements which constitute the pixel are formed in the p-type semiconductor region 5. The n-type semiconductor region 6, a p-type semiconductor region 7, an n-type semiconductor region 8, and a gate electrode 14 are illustrated here. The gate electrode 14 is formed on an insulating film (not shown) on the p-type semiconductor region 5. Note that the respective elements are isolated by an element isolation portion 13. In addition, the source region and the drain region (both of them are not shown) of each transistor which constitutes the pixel are formed in the p-type semiconductor region 5.

The n-type semiconductor region 6 forms a pn junction with the p-type semiconductor region 5. As a result, the p-type semiconductor region 5 and the n-type semiconductor region 6 form a photodiode. Furthermore, the p-type semiconductor region 7 is formed such that the n-type semiconductor region 6 serving as the charge accumulation region of the photodiode is isolated from an interface between a semiconductor and the insulating film, thereby reducing a dark current component. The photoelectric conversion portion is formed by this structure. Charges are generated in an amount corresponding to the amount of light which has been incident on the photoelectric conversion portion.

The n-type semiconductor region 8 is also referred to as a floating diffusion region, and its potential is initialized by, for example, a reset transistor (not shown) before reading out the charges generated in the photoelectric conversion portion. The charges generated in the photoelectric conversion portion are transferred to the n-type semiconductor region 8 via an n-type channel formed near the surface of the p-type semiconductor region 5 by applying a predetermined voltage to the gate electrode 14. Then, a signal corresponding to the variation amount of the potential in the n-type semiconductor region 8 is read out as a pixel signal.

One or more PMOS transistors and NMOS transistors which constitute the above-described unit are formed in the peripheral region R2. These transistors are formed in the n-type semiconductor region 4 or in a well formed in the n-type semiconductor region 4. This arrangement reduces noise which occurs when a noise component generated in the peripheral region R2 mixes into the p-type semiconductor region 5 in the pixel region R1.

The PMOS transistor is formed by an n-type semiconductor region 9 provided in the upper portion of the n-type semiconductor region 4, the gate electrode 14 provided on the insulating film on it, and two p-type semiconductor regions 11 provided in the n-type semiconductor region 9. The n-type semiconductor region 9 is an n-type well formed by the ion implantation method. Two p-type semiconductor regions 11 are the p-type source region and the p-type drain region of the PMOS transistor.

Furthermore, the NMOS transistor is formed by an p-type semiconductor region 10 provided in the upper portion of the n-type semiconductor region 4, the gate electrode 14 provided on the insulating film on it, and two n-type semiconductor regions 12 provided in the p-type semiconductor region 10. The p-type semiconductor region 10 is a p-type well formed by the ion implantation method. Two n-type semiconductor regions 12 are the n-type source region and the n-type drain region of the NMOS transistor.

Note that the above-described structure in FIG. 1 is used here. However, the present invention is not limited to this structure, and a structure in which, for example, a polarity (p type/n type) in each semiconductor region is reversed may be used. Also, the substrate 1 and the p-type semiconductor region 3 may be arranged so as to contact each other by omitting the p-type semiconductor region 2. Furthermore, the conductivity type of the n-type semiconductor region 4 is not necessarily an n type. In the structure of FIG. 1, only the conductivity type of the n-type semiconductor region 4 may be changed into the p type or an intrinsic type.

Figure 2:
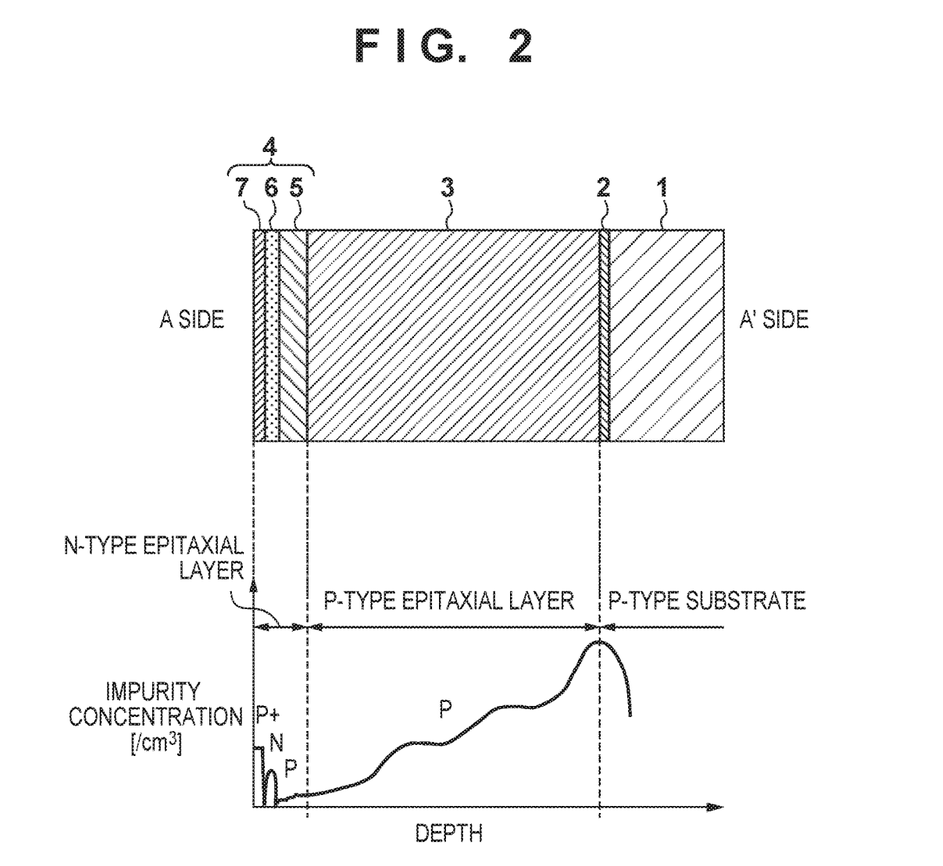
FIG. 2 is a view for explaining an impurity concentration distribution in each layer in the solid-state imaging apparatus.

FIG. 2 is a view for explaining an impurity concentration distribution in the semiconductor regions 1 to 7 along a cut line A-A' in FIG. 1. The impurity concentration distribution is an impurity concentration corresponding to positions, and is typically an impurity concentration represented as a positional function. FIG. 2 shows, for example, an impurity concentration corresponding to depths. The impurity concentration distribution may simply be referred to as an impurity distribution.

As described above, the p-type semiconductor region 2 is the high-concentration impurity region formed by implanting the p-type impurity in the p-type substrate 1. As compared to the epitaxial growth method, the ion implantation method can form the high-concentration impurity region more easily, and can form a buried high-concentration impurity region as illustrated in the p-type semiconductor region 2. Since a p-type high-concentration impurity region forms a high potential barrier against charges (here, electrons), the p-type semiconductor region 2 prevents the charges generated in the photoelectric conversion portion from leaking to the substrate 1 side.

As described above, the p-type semiconductor region 3 is the epitaxial layer formed on the p-type semiconductor region 2 by the epitaxial growth method. The p-type semiconductor region 3 is formed such that the impurity concentration decreases from the lower side (the sides of the substrate 1 and the p-type semiconductor region 2) to the upper side. This can be done by epitaxial growth while adjusting a dopant concentration in an epitaxial growth chamber after loading a substrate in the chamber. According to this impurity concentration distribution, the potential barrier becomes lower from the lower side to the upper side. Therefore, charges generated in the deep position of the substrate are collected efficiently toward the surface (upper side) of the semiconductor region. Furthermore, the epitaxial growth method can form a semiconductor region with a low lattice defect density.

The semiconductor regions 5 to 7 are respectively the p-type well, an n-type high-concentration impurity region, and the p-type high-concentration impurity region which are formed, by the ion implantation method, in part of the n-type semiconductor region 4 (epitaxial layer) provided on the p-type semiconductor region 3. Note that the n-type semiconductor region 4 (epitaxial layer) may not be formed, and the respective semiconductor regions 5 to 7 may be formed in the upper portion of the p-type semiconductor region 3.

Figure 3:
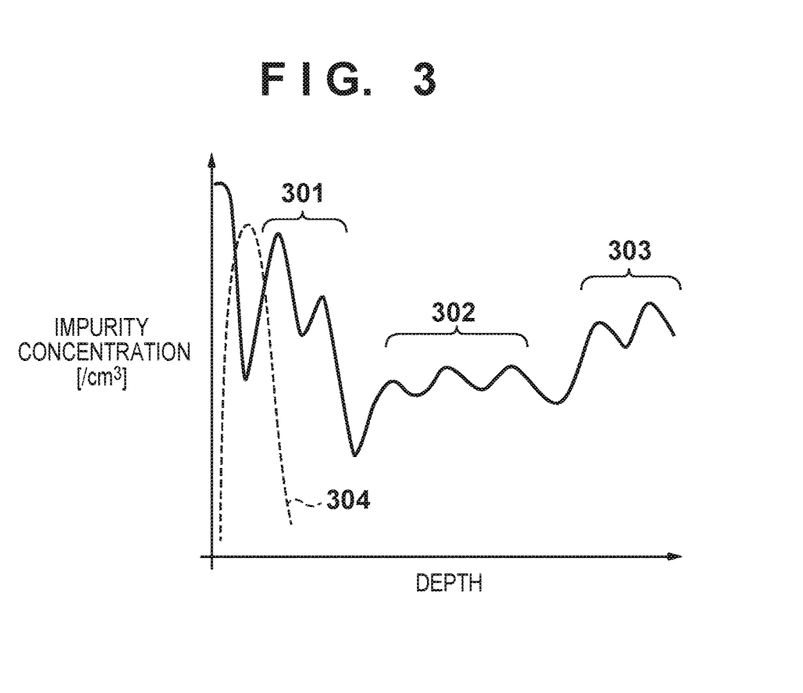
FIG. 3 is a graph for explaining the impurity concentration distribution of a p-type well in the solid-state imaging apparatus.

FIG. 3 is a graph for explaining in detail the impurity concentration distribution of FIG. 2 in the semiconductor regions 5 to 7. In FIG. 3, a solid line indicates the impurity concentration distribution of the p-type impurity, that is, the concentration distribution of an acceptor, and a broken line indicates the impurity concentration distribution of an n-type impurity, that is, the concentration distribution of a donor. Therefore, regions where the impurity concentration indicated by the solid line is higher than that of the broken line form the p-type regions (the semiconductor regions 5 and 7), and a region where the impurity concentration indicated by the broken line is higher than that of the solid line forms the n-type region (the semiconductor region 6).

The p-type semiconductor region 5 includes regions 301, 302, and 303 in the order from the upper side (the n-type semiconductor region 6 side). An impurity concentration peak of the region 302 is lower than that of the region 303. According to this impurity concentration distribution, charges from the p-type semiconductor region 3 are collected efficiently toward the surface (upper side) of the semiconductor region. The formation of the p-type semiconductor region 5 by the ion implantation method is preferably performed by setting an ion implantation condition so as not to generate a potential barrier in a boundary region between the p-type semiconductor region 3 and the p-type semiconductor region 5. Note that ion implantation may be performed a plurality of times under different implantation conditions.

Furthermore, an impurity concentration peak of the region 301 in the p-type semiconductor region 5 is higher than that of the region 302. The region 301 is formed to contact the n-type semiconductor region 6 serving as the charge accumulation region of the photodiode. That is, the region 301 is adjacent to the n-type semiconductor region 6. The region 302 is provided under the region 301. This structure narrows the width of a depletion layer in a pn junction formed by the region 301 and the n-type semiconductor region 6, and also reduces a depletion voltage to deplete the n-type semiconductor region 6 serving as the charge accumulation region almost completely. Note that the region 302 is arranged between the region 301 and the p-type semiconductor region 3 because it has the region 303 and the p-type semiconductor region 3 underneath.

In a structure in the region 301 with low impurity concentration, the width of the depletion layer in a pn junction formed by the p-type semiconductor region 5 and the n-type semiconductor region 6 is widened, and the above-described depletion voltage increases as well. Furthermore, if the impurity concentration peak position in the region 301 is deep (on the p-type semiconductor region 3 side), it may be a potential barrier when collecting charges generated by photoelectric conversion in the n-type semiconductor region 6. If the magnitude relationship of the impurity concentrations between the region 302 and the region 303 is reversed, it may also be the potential barrier. These may bring about a drop in charge transfer efficiency to the n-type semiconductor region 8.

To cope with this, in this embodiment, the respective regions 301 to 303 in the p-type semiconductor region 5 are formed, by the ion implantation method, to form the impurity concentration distribution as illustrated in FIG. 3. In other words, the impurity concentration distribution in the p-type semiconductor region 5 is formed by the ion implantation method. More specifically, the impurity concentration distribution which reduces the above-described depletion voltage while efficiently collecting the charges generated by photoelectric conversion from the p-type semiconductor region 3 to the n-type semiconductor region 6 is formed. This structure appropriately accumulates the charges generated by photoelectric conversion in the n-type semiconductor region 6 serving as the charge accumulation region, resulting in improved charge transfer efficiency to the n-type semiconductor region 8.

The structure in which the semiconductor regions 5 to 7 with the impurity concentration distribution as illustrated in FIG. 3 are formed by the ion implantation method has been exemplified here. However, the present invention is not limited to this structure. For example, in accordance with the specification or the like of the solid-state imaging apparatus, a semiconductor region with another impurity concentration distribution may be formed by the ion implantation method.

The thickness of the n-type semiconductor region 4 suffices to be a thickness that can control the impurity concentration distribution at high precision by ion implantation, and fall within in a range of, for example, 1 µm (inclusive) to 10 µm (inclusive). Furthermore, the thickness of the p-type semiconductor region 3 suffices to be a thickness suitable for formation by the epitaxial growth method, and fall within a range of, for example, 5 µm (inclusive) to 500 µm (inclusive).

Figure 4:
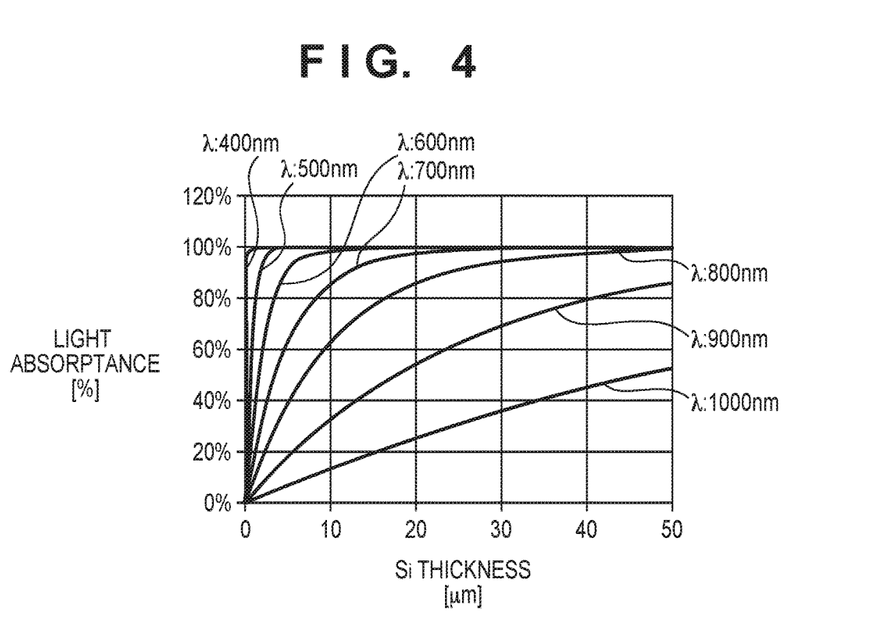
FIG. 4 is a graph for explaining a light absorptance for a semiconductor substrate.

FIG. 4 shows a light absorptance on a substrate formed by a silicon. In FIG. 4, the abscissa represents the light absorptance and the ordinate represents the thickness of the substrate, and the wavelength λ of light is represented as a parameter. According to FIG. 4, for example, the light of the wavelength λ=800 nm is absorbed almost 100% by the substrate with the thickness of 50 µm. Accordingly, when the thickness of the p-type semiconductor region 3 is about 50 µm, charges generated by, for example, red light or an infrared ray are collected efficiently toward the surface (upper side) of the semiconductor region. For example, a sensitivity is three to four times as high as in a structure in which a photoelectric conversion portion with a depth of about 3 to 5 µm is used.

Figure 5A:
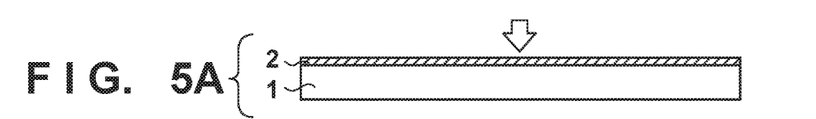
FIGS. 5A to 5F are views for explaining an example of a method for manufacturing the solid-state imaging apparatus.

FIGS. 5A to 5F are schematic views showing the respective steps of a method for manufacturing the solid-state imaging apparatus 100. First, as illustrated in FIG. 5A, a p-type impurity (for example, boron) is implanted in the p-type substrate 1 by the ion implantation method, thereby forming the p-type semiconductor region 2. The p-type semiconductor region 2 can be formed so as to obtain the impurity concentration of about, for example, $1 \times 10^{17}$ to $1 \times 10^{18}$ [cm$^{-3}$]. Note that this step may not be performed.

Figure 5B:
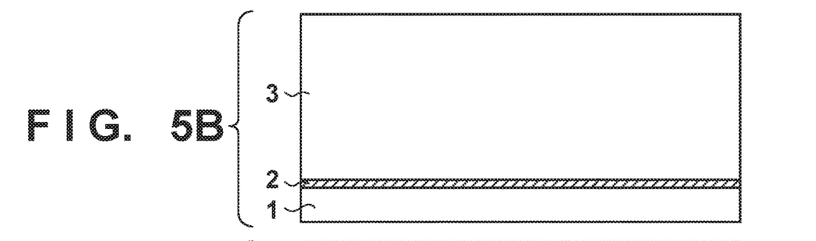

Next, as illustrated in FIG. 5B, the p-type semiconductor region 3 is formed on the p-type semiconductor region 2 by, for example, a vapor phase epitaxial growth method. This method advantageously obtains a crystal structure with less lattice defects, reduces noise components, and achieves higher accuracy of the solid-state imaging apparatus 100. The p-type semiconductor region 3 is formed such that the impurity concentration decreases from a lower side A (the sides of the substrate 1 and the p-type semiconductor region 2) to an upper side B. The impurity concentration distribution falls within a range of, for example, $1 \times 10^{15}$ to $1 \times 10^{18}$ [cm$^{-3}$]. Note that the impurity concentration distribution need only be formed so as not to generate the potential barrier against the charges (here, the electrons), and may be a gradient having an almost linear curve or may change stepwise. In this embodiment, a distribution in which the impurity concentration changes in the order of $2 \times 10^{17}$, $9 \times 10^{16}$, $4 \times 10^{16}$, $2 \times 10^{16}$, and $1 \times 10^{16}$ [cm$^{-3}$] from the lower side A to the upper side B is formed.

Figure 5C:
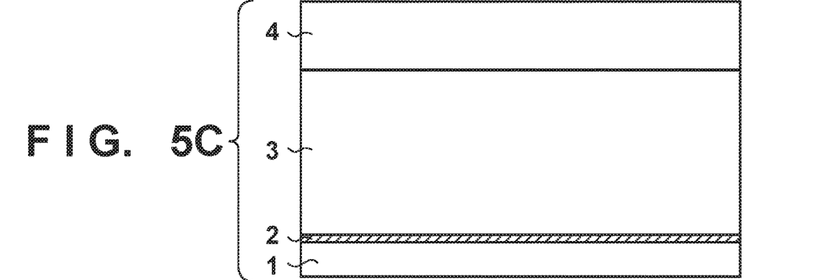

Next, as illustrated in FIG. 5C, the n-type semiconductor region 4 is formed on the p-type semiconductor region 3 by, for example, the vapor phase epitaxial growth method. The n-type semiconductor region 4 is formed so as to obtain the impurity concentration of about, for example, $1 \times 10^{14}$ to $1 \times 10^{15}$ [cm$^{-3}$] by using the n-type impurity such as phosphorus or arsenic. Here, the impurity concentration of $5 \times 10^{14}$ [cm$^{-3}$] is obtained by using phosphorus as the n-type impurity.

Figure 5D:
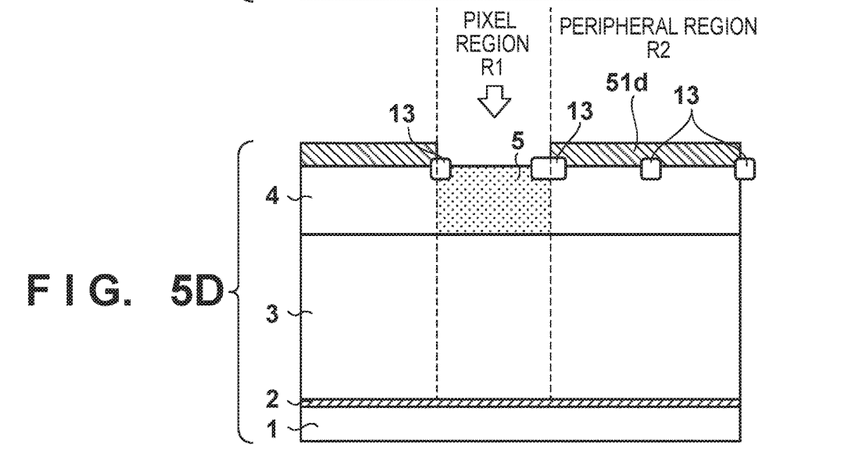

Next, in FIG. 5D, an oxide film (not shown) and also the element isolation portion 13 are formed in the n-type semiconductor region 4. Then, a photoresist 51*d* having an opening in the pixel region R1 is formed, and the p-type semiconductor region 5 (p-type well) is formed by implanting the p-type impurity using the ion implantation method. As described above, the p-type semiconductor region 5 has the impurity concentration distribution as illustrated in FIG. 3. Ion implantation to form the p-type semiconductor region 5 is performed a plurality of times under different implantation conditions. The p-type semiconductor region 5 may be formed by a plurality of p-type regions. The p-type semiconductor region 5 is preferably formed so as not to generate the potential barrier in the boundary region between the p-type semiconductor region 3 and the p-type semiconductor region 5, as described above.

Figure 5E:
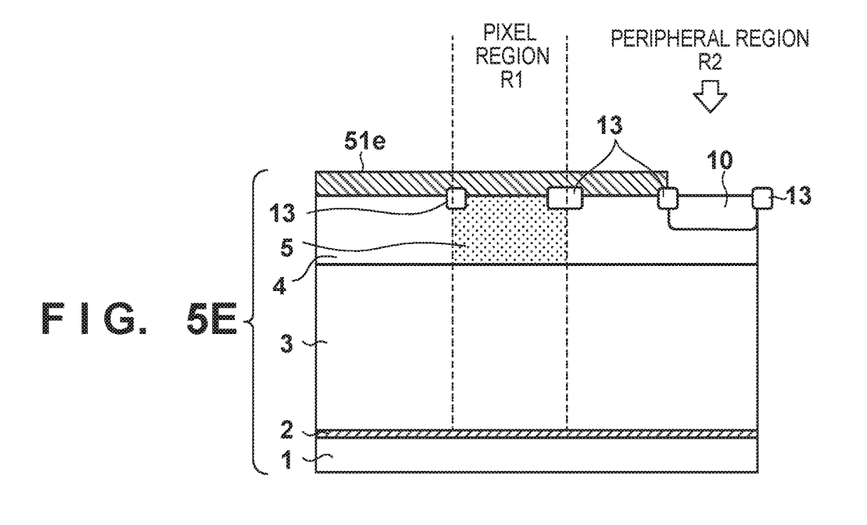

Next, as illustrated in FIG. 5E, a photoresist 51e having an opening in a region of the peripheral region R2 where the NMOS transistor should be formed is formed, and the p-type semiconductor region 10 (p-type well) is formed by implanting the p-type impurity using the ion implantation method. Note that the impurity concentration peak in the p-type semiconductor region 5 may be higher than that in the p-type semiconductor region 10, and a voltage (transfer voltage) at the time of resetting the n-type semiconductor region 8 serving as a floating diffusion may be decreased by reducing the above-described depletion voltage.

Figure 5F:
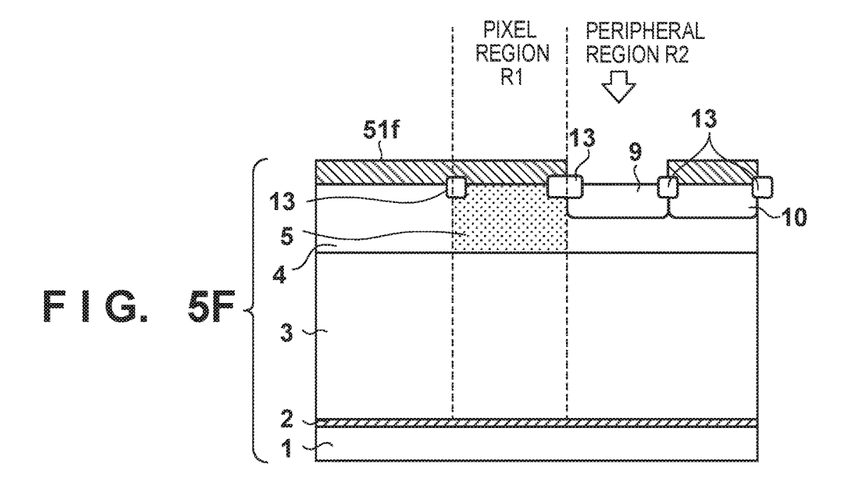

In the same manner, as illustrated in FIG. 5F, a photoresist 51f having an opening in a region of the peripheral region R2 where the PMOS transistor should be formed is formed, and the n-type semiconductor region 9 (n-type well) is formed by implanting the n-type impurity using the ion implantation method.

After that, the respective elements can be formed using a known semiconductor manufacturing process. More specifically, the respective gate electrodes 14 are formed on a gate insulating film on the semiconductor regions 5, 9, and 10. After formation of the gate electrodes 14, the n-type semiconductor regions 6, 8, and 12, and the p-type semiconductor regions 7 and 11 are additionally formed.

By using the above-described procedure, the photoelectric conversion portion and the respective elements such as the respective MOS transistors are formed, thereby completing the structure as illustrated in FIG. 1.

As described above, according to this embodiment, the p-type semiconductor region 5 is formed by the ion implantation method. The ion implantation method can adjust the impurity concentration distribution in the p-type semiconductor region 5 at higher precision than the epitaxial growth method. Hence, it is possible to accumulate the charges from the p-type semiconductor region 3 in the n-type semiconductor region 6 serving as the charge accumulation region while efficiently collecting them toward the surface (upper side) of the semiconductor region. As a result, the charge transfer efficiency to the n-type semiconductor region 8 can be improved.

As described above, this embodiment is advantageous in improving charge transfer efficiency. In particular, this embodiment is advantageous in efficiently accumulating charges generated by light, for example, red light or an infrared ray with a long wavelength that photoelectric conversion can generate in a deep region of a semiconductor substrate, and performing charge transfer.

Second Embodiment

Figure 6:
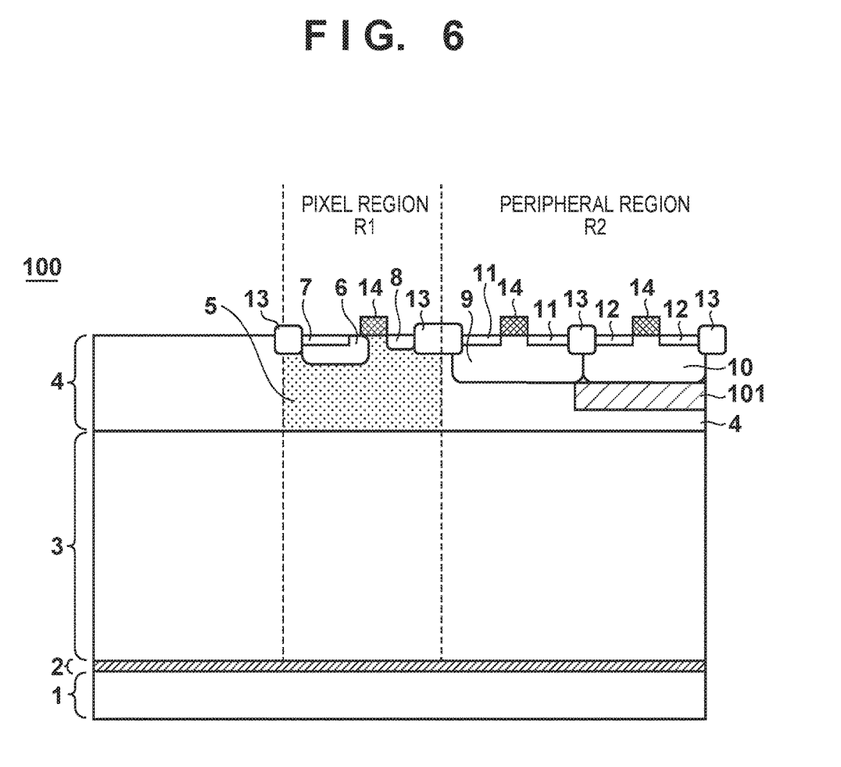
FIG. 6 is a view for explaining an example of the arrangement of a solid-state imaging apparatus.

The second embodiment will be described with reference to FIG. 6. This embodiment is different from the first embodiment in that an n-type semiconductor region 101 is provided under a p-type semiconductor region 10. The impurity concentration in the n-type semiconductor region 101 is higher than that in an n-type semiconductor region 4. According to the structure in the first embodiment (FIG. 1), a pnp parasitic bipolar transistor of the p-type semiconductor region 10, the n-type semiconductor region 4, and a p-type semiconductor region 3 is formed in a peripheral region R2. On the other hand, according to a structure in this embodiment, the parasitic bipolar transistor is prevented from being turned on by the n-type semiconductor region 101 serving as a high-concentration impurity region. Therefore, this embodiment is also advantageous in stabilizing the operation of a solid-state imaging apparatus 100 in addition to obtaining the same effects as in the first embodiment.

Two embodiments have been described above. However, the present invention is not limited to these. The present invention can change the respective arrangements in accordance with an application or the like without departing from the scope of the present invention, and can also be achieved by another embodiment.

(Imaging System)

In the above embodiments, the present invention has been described by exemplifying a solid-state imaging apparatus included in an imaging system represented by a camera or the like. The concept of the imaging system includes not only apparatuses primarily aiming at shooting but also apparatuses (for example, personal computer and portable terminal) secondarily having a shooting function. The imaging system can include the solid-state imaging apparatus according to the present invention exemplified in the above embodiments, and a processor that processes a signal output from the solid-state imaging apparatus. The processor can include, for example, an A/D converter, and a processor that processes digital data output from the A/D converter.

The solid-state imaging apparatus according to the above-described embodiments may be used in an imaging system which performs both imaging by a near infrared ray and imaging by visible light. This imaging system includes a display unit configured to output a near infrared ray image and a visible light image in a superimposed manner. This arrangement makes it possible to obtain infrared ray information while visually recognizing an object in a normal visible image.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-210588, filed Oct. 7, 2013, which is hereby incorporated by reference herein in its entirety.

What is claimed is:

1. A solid-state imaging apparatus comprising:
   a first semiconductor region of a first conductivity type provided on a substrate;
   a second semiconductor region of the first conductivity type provided on the first semiconductor region;
   a third semiconductor region of a second conductivity type provided in the second semiconductor region such that a pn junction is formed between the second semiconductor region and the third semiconductor region;
   a fourth semiconductor region of the second conductivity type provided on the first semiconductor region; and
   a MOS transistor having a source region of the second conductivity type and a drain region of the second conductivity type which are provided in a well of the first conductivity type, wherein the first semiconductor region is formed such that an impurity concentration of the first semiconductor region decreases as a position within the first semiconductor region goes from a side of the substrate toward a side of the third semiconductor region, and wherein the well and the first semiconductor region are electrically isolated by the fourth semiconductor region.

2. The apparatus according to claim 1, wherein the second semiconductor region includes a first region adjacent to the third semiconductor region in a depth direction and a second region provided between the first region and the first semiconductor region in the depth direction, and wherein an impurity concentration of the first conductivity type of the first region is higher than that of the second region.

3. The apparatus according to claim 2, wherein the second semiconductor region further includes a third region provided between the second region and the first semiconductor region in the depth direction, and wherein an impurity concentration of the first conductivity type of the third region is higher than that of the second region.

4. The apparatus according to claim 3, wherein the impurity concentration of the first conductivity type of the third region in the second semiconductor region is lower than that of a portion of the first semiconductor region near a boundary between the first semiconductor region and the second semiconductor region.

5. The apparatus according to claim 1, wherein the third semiconductor region forms a part of a photoelectric conversion portion.

6. The apparatus according to claim 1, wherein the first semiconductor region and the second semiconductor region form potentials that drift a minority carrier in the first semiconductor region and a minority carrier in the second semiconductor region toward the third semiconductor region.

7. The apparatus according to claim 1, wherein the impurity concentration of the first conductivity type in the second semiconductor region is lower than that of the portion of the first semiconductor region near a boundary between the first semiconductor region and the second semiconductor region.

8. The apparatus according to claim 1, wherein the impurity concentration distribution in the second semiconductor region includes a plurality of impurity concentration peaks of the first conductivity type.

9. The apparatus according to claim 1, wherein the first semiconductor region is provided by an epitaxial growth method.

10. The apparatus according to claim 1, wherein the fourth semiconductor region is provided by an epitaxial growth method.

11. The apparatus according to claim 1, wherein the second semiconductor region is formed by performing an ion implantation method to implant impurity in a region provided simultaneously with the fourth semiconductor region.

12. The apparatus according to claim 1, comprising a plurality of pixels each including a photoelectric conversion portion and a unit configured to exchange signals between the plurality of pixels, wherein the unit is provided in the fourth semiconductor region, and includes the MOS transistor.

13. The apparatus according to claim 1, wherein the well of the first conductivity type is provided in the fourth semiconductor region, wherein a fifth semiconductor region of the second conductivity type is provided between the well and a part of the fourth semiconductor region, and wherein an impurity concentration of the fifth semiconductor region is higher than that of the fourth semiconductor region.

14. The apparatus according to claim 12, comprising a pixel region in which the plurality of pixels are arrayed, and a peripheral region which is different from the pixel region and in which the unit is arranged.

15. The apparatus according to claim 1, wherein a thickness of the first semiconductor region falls within a range of 5 μm (inclusive) to 500 μm (inclusive).

16. The apparatus according to claim 1, wherein a thickness of the second semiconductor region falls within a range of 1 μm (inclusive) to 10 μm (inclusive).

17. The apparatus according to claim 1, further comprising a sixth semiconductor region of the first conductivity type provided between the substrate and the first semiconductor region, wherein an impurity concentration of the first conductivity type in the sixth semiconductor region is higher than that in the first semiconductor region.

18. An imaging system comprising:

a solid-state imaging apparatus defined in claim 1, and a display unit configured to output a near infrared ray image and a visible light image obtained by the solid-state imaging apparatus in a superimposed manner.

* * * * *